US008021820B2

(12) United States Patent
O'Donoghue et al.

(10) Patent No.: US 8,021,820 B2
(45) Date of Patent: Sep. 20, 2011

(54) COATING COMPOSITION FOR MARKING SUBSTRATES

(75) Inventors: Karen O'Donoghue, Epping (GB); Jonathan Campbell, Riehen (CH); Ian Street, Manchester (GB)

(73) Assignee: Datalase Ltd., Cheshire (GB)

( * ) Notice: Subject to any disclaimer, the term of this patent is extended or adjusted under 35 U.S.C. 154(b) by 210 days.

(21) Appl. No.: 12/087,806

(22) PCT Filed: Jan. 17, 2007

(86) PCT No.: PCT/EP2007/050421

§ 371 (c)(1),
(2), (4) Date: Apr. 3, 2009

(87) PCT Pub. No.: WO2007/088104

PCT Pub. Date: Aug. 9, 2007

(65) Prior Publication Data

US 2009/0191420 A1 Jul. 30, 2009

(30) Foreign Application Priority Data

Jan. 31, 2006 (EP) .................................... 06101082

(51) Int. Cl.
*G03F 7/00* (2006.01)
*G03F 7/004* (2006.01)

(52) U.S. Cl. ......... 430/270.1; 430/7; 430/905; 430/944; 430/964; 430/945

(58) Field of Classification Search ............... 430/270.1, 430/7, 905, 944, 945, 964
See application file for complete search history.

(56) References Cited

U.S. PATENT DOCUMENTS

| | | | | |
|---|---|---|---|---|
| 4,820,683 | A | 4/1989 | Vervacke et al. | 503/210 |
| 5,413,629 | A | 5/1995 | Yasui et al. | 106/21 |
| 5,446,011 | A | 8/1995 | Hayakawa et al. | 503/209 |
| 5,897,938 | A * | 4/1999 | Shinmoto et al. | 428/354 |
| 6,210,472 | B1 * | 4/2001 | Kwan et al. | 106/31.14 |
| 7,144,676 | B2 * | 12/2006 | Barr et al. | 430/270.1 |
| 2004/0157947 | A1 | 8/2004 | Heneghan | 522/2 |
| 2006/0040217 | A1 | 2/2006 | Stubbs | 430/363 |
| 2006/0154818 | A1 * | 7/2006 | Destro et al. | 503/201 |

FOREIGN PATENT DOCUMENTS

| | | | |
|---|---|---|---|
| EP | 0319283 | | 6/1989 |
| EP | 319283 | A2 * | 6/1989 |
| EP | 0600441 | | 6/1994 |
| EP | 600441 | A1 * | 6/1994 |
| WO | 02100914 | | 12/2002 |
| WO | WO 02100914 | A2 * | 12/2002 |
| WO | 2004/043704 | | 5/2004 |
| WO | 2005/012442 | | 2/2005 |
| WO | 2005/108103 | A2 | 11/2005 |
| WO | 2006/067073 | | 6/2006 |
| WO | WO 2006067073 | A1 * | 6/2006 |

* cited by examiner

*Primary Examiner* — Amanda C. Walke
(74) *Attorney, Agent, or Firm* — Stoel Rives LLP

(57) ABSTRACT

Composition, which comprises a latent activator and a colour former, a process for the preparation of these compositions, substrates coated with these compositions and a process for their preparation, a process for preparing marked substrates using these compositions and marked substrates obtainable by the latter process.

14 Claims, No Drawings

COATING COMPOSITION FOR MARKING SUBSTRATES

The present invention refers to a coating composition for marking substrates, to a process for the preparation of these compositions, to substrates coated with these compositions and to a process for their preparation, to a process for preparing marked substrates using these compositions, and to marked substrates obtainable by the latter process.

Packaging usually needs to be marked with information such as logos, bar codes, expiry dates or batch numbers. One way to achieve this is by coating the packaging with a composition, which upon treatment with energy such as heat forms a visible marking. When using laser irradiation as energy, the marking can be even so small that it is invisible or nearly invisible to the human eye.

WO 02/074548 describes coating compositions comprising an oxyanion of a multivalent metal, for example ammonium octamolybdate (AOM), a binder and a solvent. These compositions were coated on a substrate, for example cartonboard, dried and exposed to an IR laser to produce a black marking.

WO 2004/043704 describes coating compositions comprising an amine compound of molybdenum, tungsten or vanadium, an organic solvent and optionally a polymeric binder and/or a colour former. An example of an "amine molybdate" is bis(2-ethylhexyl)amine octamolybdate. The compositions were coated on substrates such as polyethylene terephthalate film, aluminium foil or polypropylene packaging film, dried and exposed to an IR laser or thermal printer to produce grey/black or coloured markings.

WO 2005/012442 describes coating compositions comprising a pigment, water or an organic solvent, a conductive polymer and optionally a binder. The pigment can be an oxyanion of molybdate or tungstate.

The disadvantage of the coating compositions of WO 02/074548, WO 2004/043704 and WO 2005/012442 is that they are based on heavy metals.

WO 02/068205 describes a method for marking an object, wherein the object comprises or is coated with a formulation comprising a material having functional groups such as polyhydroxy compounds, and a metal compound such as alkali metal, alkaline earth metal, iron oxides or salts and organometallics. The two components react on irradiation with a laser to form a yellow or grey/green marking.

The compositions of WO 02/068205 have the disadvantage that they only provide yellow or grey/green markings, but no high contrast coloured markings of any desired colour. In addition, the described compositions are not suitable for coating paper or plastics.

It is an object of the present invention to provide coating compositions, which yield high contrast coloured markings of any desired colour on exposure to energy and which are not based on heavy metals.

These objects are solved by the coating composition comprising a latent activator and a colour former.

The composition of the present invention comprises a latent activator and a colour former.

The latent activator can be either an acid derivative or a salt of an acid and an amine.

The acid derivative can be any derivative of an acid having a pKa in water at 25° C. of below 10.0. Preferably, it is a derivative of an acid having a pKa of below 5.0, more preferably of below 3.0.

Preferred acid derivatives are derivatives of sulfuric acids, phosphoric acids or carboxylic acids.

Examples of sulfuric acids are sulfuric acid, fluorosulfuric acid, chlorosulfuric acid, nitrosylsulfuric acid, 4-styrene sulfonic acid, p-toluenesulfonic acid, benzene sulfonic acid, xylene sulfonic acid, phenol sulfonic acid, methane sulfonic acid, trifluormethane sulfonic acid, poly(4-styrene sulfonic acid) and coplymers comprising 4-styrene sulfonic acid units such as poly(4-styrenesulfonic acid-co-maleic acid). Examples of phosphoric acids are phosphoric acid, fluorophosphoric acid and hexafluorophosphoric acid. Examples of carboxylic acids are dichloroacetic acid, trichloroacetic acid, oxalic acid and maleic acid.

More preferred acid derivatives are ester, amide and thioester derivatives of sulfuric acids, phosphoric acids or carboxylic acids.

Ester, amide and thioester derivatives of sulfuric acids, phosphoric acids or carboxylic acids can be sulfuric acids, phosphoric acids or carboxylic acids having at least one OH-group substituted with $OR^1$, $NR^2R^3$ or $SR^4$, wherein $R^1$, $R^2$, $R^3$ and $R^4$ can be $C_{1-30}$-alkyl, $C_{2-30}$-alkenyl, $C_{4-8}$-cycloalkyl, $C_{7-12}$-bicycloalkyl, $C_{5-8}$-cycloalkenyl, aralkyl, aralkenyl or aryl, which can be unsubsituted or substituted with $C_{1-6}$-alkyl, $C_{1-6}$-alkoxy, halogen, hydroxyl, $C(O)OC_{1-6}$-alkyl or $OC(O)C_{1-6}$-alkyl.

Ester, amide and thioester derivatives of sulfuric acids, phosphoric acids or carboxylic acids can also be two acids, selected from the group consisting of sulfuric acids, phosphoric acids and carboxylic acids, being linked by an O-A-O, $NR^5$-E-$R^6N$ or S-J-S group, wherein $R^5$ and $R^6$ can be as defined for $R^1$, $R^2$, $R^3$ and $R^4$, and A, E and J can be $C_{2-14}$-alkylene, $C_{2-14}$-alkenylene, $C_{4-8}$-cycloalkylene, $C_{4-8}$-cycloalkenylene or arylene, which can be unsubsituted or substituted with $C_{1-6}$-alkyl, $C_{1-6}$-alkoxy, halogen, hydroxyl, $C(O)OC_{1-6}$-alkyl or $OC(O)C_{1-6}$-alkyl.

Examples of $C_{1-30}$-alkyl are methyl, ethyl, propyl, isopropyl, butyl, sec-butyl, isobutyl, tert-butyl, pentyl, hexyl, heptyl, octyl, nonyl, decyl, undecyl, dodecyl, myristyl, palmityl, stearyl and arachinyl. Examples of $C_{2-30}$-alkenyl are vinyl, allyl, linolenyl, docosahexaenoyl, eicosapentaenoyl, linoleyl, arachidonyl and oleyl. Examples of $C_{4-8}$-cyclalkyl are cyclopentyl and cyclohexyl. An example of a $C_{7-12}$-bicycloalkyl is 2-norbornyl. An example of $C_{5-8}$-cycloalkenyl is cyclohexenyl. Examples of aralkyl are benzyl and 2-phenylethyl. Examples of aryl are phenyl, 1,3,5-triazinyl or naphthyl. Examples of $C_{1-6}$-alkyl are methyl, ethyl, propyl, isopropyl, butyl, sec-butyl, isobutyl, tert-butyl, pentyl, and hexyl. Examples of $C_{1-6}$-alkoxy are methoxy, ethoxy, propoxy, isopropoxy, butoxy, sec-butoxy, tert-butxy, isobutoxy, pentoxy and hexoxy. Examples of halogens are chlorine and bromine. Examples of $C_{2-14}$-alkylene are ethylene, trimethylene, tetramethylene, ethylethylene, pentamethylene, hexamethylene, heptamethylene and octamethylene. Examples of $C_{4-8}$-cycloalkylene are cyclopentylene and cyclohexylene. Examples of $C_{4-8}$-cycloalkenylene are cyclopentenylene and cyclohexenylene. An example of arylene is phenylene.

Preferred $C_{1-30}$-alkyls are $C_{1-6}$-alkyl and preferred $C_{2-30}$-alkenyls are $C_{2-6}$-alkenyl. Examples of $C_{2-6}$-alkenyl are vinyl and allyl.

Even more preferred acid derivatives are ester, amide and thioester derivatives of sulfuric acids. Especially preferred acid derivatives are ester derivatives of sulfuric acids, in particular of organic sulfuric acids.

Examples of organic sulfuric acids are 4-styrene sulfonic acid, p-toluenesulfonic acid, benzene sulfonic acid, xylene sulfonic acid, phenol sulfonic acid, methane sulfonic acid, trifluormethane sulfonic acid, poly(4-styrene sulfonic acid) and coplymers comprising 4-styrene sulfonic acid units such as poly(4-styrenesulfonic acid-co-maleic acid).

Preferred ester derivatives of organic sulfuric acids are organic sulfuric acids having at least one OH-group substituted with $OR^1$, wherein $R^1$ can be $C_{1-6}$-alkyl or $C_{4-8}$-cycloalkyl, which can be unsubsituted or substituted with $C_{1-6}$-alkyl or $C(O)OC_{1-6}$-alkyl. Preferred ester derivatives of organic sulfuric acids are also two sulfuric acids being linked by an O-A-Q group, wherein A is $C_{4-8}$-cycloalkylene. A preferred organic sulfonic acid is p-toluenesulfonic acid.

More preferred ester derivatives of organic sulfuric acids are cyclohexyl-p-toluenesulfonate, 2-methylcyclohexyl-p-toluenesulfonate, menthyl-p-toluenesulfonate, 1,4-cyclohexanediol di-p-toluenesulfonate, 4-tosylcyclohexanecarboxylic acid ethyl ester and 2,2-dimethylpropyl-p-toluenesulfonate.

The acid derivatives are either commercially available or can be prepared by known processes, e.g. by the reaction of a suitable alcohol with a suitable sulfonyl chloride in the presence of a catalyst.

The acid can have a pKa in water at 25° C. of below 10.0. Preferably, it has a pKa of below 5.0, more preferably of below 3.0.

Preferred acids are sulfuric acids, phosphoric acids or carboxylic acids. More preferred acids are sulfuric acids. Most preferred acids are organic sulfuric acids.

The amine can be of formula $NR^7R^8R^9$, wherein $R^7$, $R^8$ and $R^9$ can be the same or different and can be hydrogen, $C_{1-30}$-alkyl, $C_{2-30}$-alkenyl, $C_{4-8}$-cycloalkyl, $C_{5-8}$-cycloalkenyl, aralkyl, aralkenyl or aryl, which can be unsubstituted or substituted with amino and/or hydroxy, or $R^8$ and $R^9$, together with the nitrogen of the amine, form a 5- to 7-membered ring.

Examples of amines of formula $NR^7R^8R^9$ are ammonia, methylamine, ethylamine, propylamine, butylamine, diethylamine, ethylene diamine, 1,2-diaminopropane, ethanolamine, cyclohexylamine, aniline, melamine, pyrrole, morpholine, pyrrolidine and piperidine.

Preferably, the amine is of formula $NR^7R^8R^9$, wherein $R^7$ is hydrogen and $R^8$ and $R^9$ can be the same or different and can be hydrogen, $C_{1-30}$-alkyl, $C_{2-30}$-alkenyl, $C_{4-8}$-cycloalkyl, $C_{5-8}$-cycloalkenyl, aralkyl, aralkenyl or aryl, which can be unsubstituted or substituted with amino and/or hydroxy, or $R^8$ and $R^9$, together with the nitrogen of the amine, form a 5- to 7-membered ring.

More preferably, the amine is of formula $NR^7R^8R^9$, wherein $R^7$ and $R^8$ are hydrogen and $R^9$ can be hydrogen, $C_{1-30}$-alkyl, $C_{2-30}$-alkenyl, $C_{4-8}$-cycloalkyl, $C_{5-8}$-cycloalkenyl, aralkyl, aralkenyl or aryl, which can be unsubstituted or substituted with amino and/or hydroxy.

Most preferably, the latent activator is an acid derivative.

The colour former can be any suitable colour former such as a phthalide, a fluoran, a triarylmethane, a benzoxazine, a quinazoline, a spiropyran, a quinone, a thiazine or an oxazine or mixtures thereof.

Examples of phthalides are crystal violet lactone (3,3-bis (p-dimethylaminophenyl)-6-dimethylaminophtalide), 3,3-bis(p-dimethylaminophenyl)phthalide, 3,3-bis(1-ethyl-2-methylindol-3-yl)phthalide, 3,3-bis(1-octyl-2-methylindol-3-yl)phthalide, 3-(4-diethylaminophenyl)-3-(1-ethyl-2-methylindol-3-yl)-phthalide, 7-(N-ethyl-N-isopentylamino)-3-methyl-1-phenylspiro[4H-chromeno[2,3-c]pyrazole-4 (1H)-3'phthalide, 3,6,6'-tris(dimethylamino)spiro[fluorene-9,3'-phthalide], 3,6,6'-tris(diethylamino)spiro[fluorene-9,3'-phthalide], 3,3-bis-[2-(p-dimethylaminophenyl)-2-(p-methoxyphenyl)ethenyl-4,5,6,7-tetrabromophthalide, 3,3-bis-[2-(p-dimethylaminophenyl)-2-(p-methoxyphenyl) ethenyl-4,5,6,7-tetrachlorophthalide, 3,3-bis[1,1-bis(4-pyrrolidinophenyl)ethylene-2-yl]-4,5,6,7-tetrabromophthalide, 3,3-bis-[1-(4-methoxyphenyl)-1-(4-pyrridinophenyl)ethylene-2-yl]-4,5,6,7-tetrachlorophthalide, 3-(4-diethylamino-2-ethoxyphenyl)-3-(1-ethyl-2-methylindol-3-yl)-4-azaphthalide, 3-(4-diethylamino-2-ethoxyphenyl)-3-(1-octyl-2-methylindol-3-yl)-4-azaphthalide and 3-(4-cyclohexylethylamino-2-methoxyphenyl)-3-(1-ethyl-2-methylindol-3-yl)-4-azaphthalide The phthalides can be prepared by methods known in the art, for example crystal violet lactone can be prepared as described in GB 1,347,467, and 3,3-bis(1-ethyl-2-methylindol-3-yl)phthalide can be prepared as described in GB 1,389,716.

Examples of fluorans are 3-di(ethyl)amino-6-methyl-7-(tert-butoxycarbonyl)anilinofluoran, 3-diethylamino-7-dibenzylaminofluoran, 3-dibutylamino-7-dibenzylaminofluoran, 3-diethylamino-6-methyl-7-(dibenzylamino)fluoran, 3-diethylamino-6-methylfluoran, 3-diethylamino-6-chloro-7-methylfluoran, 3-diethylamino-6-methyl-7-chlorofluoran, 3-diethylamino-7-tert-butylfluoran, 3-diethylamino-7-carboxyethylfluoran, 3-diethylamino-7-methylfluoran, 3-diethylamino-6,8-dimethylfluoran, 3-diethylamino-7-chlorofluoran, 3-dibutylamino-6-methylfluoran, 3-cyclohexylamino-6-chlorofluoran, 3-diethylamino-benzo [a]fluoran, 3-diethylaminobenzo[c]fluoran, 3-dimethylamino-6-methyl-7-anilinofluoran, 3-diethylamino-6-methyl-7-anilinofluoran, 3-diethylamino-6-methyl-7-(2,4-dimethylanilino)fluoran, 3-diethylamino-6-methyl-7-(3-trifluoromethylanilino)fluoran, 3-diethylamino-6-methyl-7-(2-chloroanilino)fluoran, 3-diethylamino-6-methyl-7-(p-chloroanilino)fluoran, 3-diethylamino-6-methyl-7-(2-fluoroanilino)fluoran, 3-diethylamino-6-methyl-7-(p-octylanilino)fluoran, 3-diethylamino-7-(p-octylanilino) fluoran, 3-diethylamino-6-methyl-7-(p-methylanilino) fluoran, 3-diethylamino-6-ethoxyethyl-7-anilinofluoran, 3-diethylamino-6-methyl-7-(3-methylanilino)fluoran, 3-diethylamino-7-(3-trifluoromethylanilino)fluoran, 3-diethylamino-7-(2-chloroanilino)fluoran, 3-diethylamino-7-(2-fluoroanilino)fluoran, 3-diethylamino-6-chloro-7-anilinofluoran, 3-dibutylamino-6-methyl-7-anilinofluoran, 3-dibutylamino-6-methyl-7-(2,4-dimethylanilino)fluoran, 3-dibutylamino-6-methyl-7-(2-chloroanilino)fluoran, 3-dibutylamino-6-methyl-7-(4-chloroanilino)fluoran, 3-dibutylamino-6-methyl-7-(2-fluoroanilino)fluoran, 3-dibutylamino-6-methyl-7-(3-trifluoromethylanilino)fluoran, 3-dibutylamino-6-ethoxyethyl-7-anilinofluoran, 3-dibutylamino-6-chloro-anilinofluoran, 3-dibutylamino-6-methyl-7-(4-methylanilino)fluoran, 3-dibutylamino-7-(2-chloroanilino)fluoran, 3-dibutylamino-7-(2-fluoroanilino) fluoran, 3-dipentylamino-6-methyl-7-anilinofluoran, 3-dipentylamino-6-methyl-7-(4-2-chloroanilino)fluoran, 3-dipentylamino-7-(3-trifluoromethylanilino)fluoran, 3-dipentylamino-6-chloro-7-anilinofluoran, 3-dipentylamino-7-(4-chloroanilino)fluoran, 3-pyrrolidino-6-methyl-7-anilinofluoran, 3-piperidino-6-methyl-7-anilinofluoran, 3-(N-methyl-N-propylamino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-N-hexylamino)-7-anilinofluoran, 3-(N-ethyl-p-toluidino)amino-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-isoamylamino)-7-(2-chloroanilino)-fluoran, 3-(N-ethyl-N-isoamylamino)-6-chloro-7-anilinofluoran, 3-(N-ethyl-N-tetrahydrofurfurylamino)-6-methyl-7-anilinofluoran, 3-(N-ethyl-N-isobutylamino)-6-methyl-7-anilinofluoran, 3-(N-butyl-N-isoamylamino)-6-methyl-7-anilinofluoran, 3-(N-isopropyl-N-3-pentylamino)-6-methyl-7-anilinofluoran, 3-(N-ethyl-N-ethoxypropylamino)-6-methyl-7-anilinofluoran, 2-methyl-6-p-(p-dimethylaminophenyl)aminoanilinofluoran, 2-methoxy-6-p-(p-dimethylaminophenyl)aminoanilinofluoran, 2-chloro-3-methyl-6-p-(p-phenylaminophenyl)aminoanilinofluoran, 2-diethylamino-6-p-(p-dimethylaminophenyl)aminoanilinofluoran, 2-phenyl-6-methyl-6-p-(p-phenylaminophenyl)aminoanilinofluoran, 2-benzyl-6-p-(p-phenylaminophenyl)aminoanilinofluoran, 3-methyl-6-p-(p-dimethylaminophenyl)aminoanilinofluoran, 3-diethylamino-6-p-(p-diethylaminophenyl)aminoanilinofluoran, 3-diethylamino-6-p-(p-dibutylaminophenyl)aminoanilinofluoran and 2,4-dimethyl-6-[(4-dimethylamino)anilino]fluoran.

The fluorans can be prepared by methods known in the art, for example 3-diethylamino-7-dibenzylaminofluoran, 3-diethylamino-7-tert-butylfluoran, 3-diethylamino-6-methyl-7-anilinofluoran and 3-diethylamino-6-methyl-7-(2,4-dimethylanilino)fluoran and can be prepared as described in U.S. Pat. No. 5,166,350 A, 3-diethylamino-6-methyl-7-(3-methylanilino)fluoran can be prepared as described in EP 0 546 577 A1, 3-diethylamino-6-chloro-7-anilinofluoran can be prepared as described in DE 2130845, 3-pyrrolidino-6-methyl-7-anilinofluoran and 3-piperidino-6-methyl-7-anilinofluoran can be prepared as described in U.S. Pat. No. 3,959,571 A, 3-(N-ethyl-N-isoamylamino)-6-methyl-7-anilinofluoran can be prepared as described in GB 2 002 801 A, and 3-(N-methyl-N-propylamino)-6-methyl-7-anilinofluoran can be prepared as described in GB 2 154 597 A.

Examples of benzoxazines are 2-phenyl-4-(4-diethylaminophenyl)-4-(4-methoxyphenyl)-6-methyl-7-dimethylamino-3,1-benzoxazine, which can be prepared as described in EP 0 187 329 A1, and 2-phenyl-4-(4-diethylaminophenyl)-4-(4-methoxyphenyl)-8-methyl-7-dimethylamino-3,1-benzoxazine.

An example of a quinazoline is 4,4'-[1-methylethylidene)bis(4,1-phenyleneoxy-4,2-quinazolinediyl)]bis[N,N-diethylbenzeneamine]. An example of a triarylmethane is bis(N-methyldiphenylamine)-4-yl-(N-butylcarbazole)-3-yl-methane, which can be prepared as described in GB 1,548,059.

Examples of spiropyrans are 1',3',3'-trimethylspiro[2H-1-benzopyran-2,2'-indoline], 1,3,3-trimethylspiro[indoline-2,3'-[3H]naphth[2, 1 -b][1,4]oxazine] and 1',3',3'-trimethylspiro[2 H-1-benzothiopyran-2,2'-indoline].

An example of a quinone is hematoxyline. An example of an oxazine is 3,7-bis(dimethylamino)-10-benzoylphenoxazine. An example of a thiazine is 3,7-bis(dimethylamino)-10-benzoylphenothiazine.

Preferably, the colour former is a phthalide or a fluoran or mixtures thereof.

More preferably, the colour former is crystal violet lactone or 3,3-bis(p-dimethylaminophenyl)-6-dimethylaminophtalide as sold for example under the tradename Ciba® Pergascript® Blue I-2RN, 3,3-bis(1-octyl-2-methylindol-3-yl)phthalide as sold for example under the tradename Ciba® Pergascript® Red I-6B or 3-diethylamino-7-(ethoxycarbonyl)-fluoran as sold for example under the tradename Ciba® Pergascript® Orange I-G).

Preferably, the composition also comprises a solvent. The solvent can be water, an organic solvent, a liquid monomer or mixtures thereof. Preferably, the solvent is water, an organic solvent or mixtures thereof.

Examples of organic solvents are $C_{1-4}$-alkanols, $C_{2-4}$-polyols, $C_{3-6}$-ketones, $C_{4-6}$-ethers, $C_{2-3}$-nitriles, nitromethane, dimethylsulfoxide, dimethylformamide, dimethylacetamide, N-methyl pyrolidone and sulfolane, whereby $C_{1-4}$-alkanols and $C_{2-4}$-polyols may be substituted with $C_{1-4}$-alkoxy. Examples of $C_{1-4}$-alkanols are methanol, ethanol, propanol, isopropanol or butanol, isobutanol, sec-butanol and tert-butanol. Examples of a $C_{1-4}$-alkoxy-derivatives thereof are 2-ethoxyethanol and 1-methoxy-2-propanol. Examples of $C_{2-4}$-polyols are glycol and glycerol. Examples of $C_{3-6}$-ketones are acetone and methyl ethyl ketone. Examples of $C_{4-6}$-ethers are dimethoxyethane, diisopropylethyl and tetrahydrofurane. An example of a $C_{2-3}$-nitrile is acetonitrile.

More preferably, the solvent is organic solvent.

Even more preferably, the solvent is an organic solvent is selected from the group consisting of $C_{1-4}$-alkanols, $C_{2-4}$-polyols, $C_{3-6}$-ketones, dimethylformamide and dimethylacetamide, whereby $C_{1-4}$-alkanols and $C_{2-4}$-polyols may be substituted with $C_{1-4}$-alkoxy.

Most preferably, the solvent is acetone, methyl ethyl ketone and mixtures thereof.

Preferably, the composition of the present invention also comprises a polymeric binder.

Examples of polymeric binders are acrylic polymers, styrene polymers and hydrogenated products thereof, vinyl polymers and derivatives thereof, polyolefins and hydrogenated or epoxidized products thereof, aldehyde polymers, epoxide polymers, polyamides, polyesters, polyurethanes, sulfone-based polymers and natural polymers and derivatives thereof. The polymeric binder can also be a mixture of polymeric binders. It can also be a mixture of liquid monomers and a suitable photoinitiator that forms one of the above listed polymeric binders under UV irradiation after coating. In this case, the monomers function as the solvent.

Acrylic polymers are polymers formed from at least one acrylic monomer or from at least one acrylic monomer and at least one other ethylenically unsaturated polymer such as a styrene monomer, vinyl monomer, olefin monomer or maleic monomer.

Examples of acrylic monomers are (meth)acrylic acid or salts thereof, (meth)acrylamide, (meth)acrylonitrile, $C_{1-6}$-alkyl (meth)acrylates such as ethyl (meth)acrylate, butyl (meth)acrylate or hexyl (meth)acrylate, 2-ethylhexyl (meth)acrylate, substituted $C_{1-6}$-alkyl (meth)acrylates such as glycidyl methacrylate and acetoacetoxyethyl methacrylate, di($C_{1-4}$-alkylamino)$C_{1-6}$-alkyl (meth)acrylates such as dimethylaminoethyl acrylate or diethylaminoethyl acrylate, amides formed from $C_{1-6}$-alkylamines, substituted $C_{1-6}$-alkylamines such as 2-amino-2-methyl-1-propane sulfonic acid, ammonium salt, or di($C_{1-4}$-alkylamino)$C_{1-6}$-alkylamines and (meth)acrylic acid and $C_{1-4}$-alkyl halide adducts thereof.

Examples of styrene monomers are styrene, 4-methylstyrene and 4-vinylbiphenyl. Examples of vinyl monomers are vinyl alcohol, vinyl chloride, vinylidene chloride, vinyl isobutyl ether and vinyl acetate. Examples of olefin monomers are ethylene, propylene, butadiene and isoprene and chlorinated or fluorinated derivatives thereof such as tetrafluroethylene. Examples of maleic monomers are maleic acid, maleic anhydride and maleimide.

Examples of acrylic polymers are poly(methyl methacrylate) and poly(butyl methacrylate).

Styrene polymers are polymers formed from at least one styrene monomer and at least one vinyl monomer, olefin monomer and/or maleic monomer. Examples of styrene polymers are styrene butadiene styrene block polymers, styrene ethylene butadiene block polymers, styrene ethylene propylene styrene block polymers and styrene-maleic anhydride copolymers.

Vinyl polymers are polymers formed from at least one vinyl monomer or from at least one vinyl monomer and at least one olefin monomer or maleic monomer. Examples of vinyl polymers are polyvinyl chloride, polyvinylalcohol, polyvinylacetate, partially hydrolysed polyvinyl acetate and methyl vinyl ether-maleic anhydride copolymers. Examples of derivatives thereof are carboxy-modified polyvinyl alcohol, acetoacetyl-modified polyvinyl alcohol, diacetone-modified polyvinyl alcohol and silicon-modified polyvinyl alcohol.

Polyolefins are polymers formed from at least one olefin monomer or from at least one olefin monomer or maleic monomer. Examples of polyolefines are polyethylene, polypropylene, polybutadiene and isopropylene-maleic anhydride copolymer.

Aldehyde polymers are polymers formed from at least one aldehyde monomer or polymer and at least one alcohol monomer or polymer, amine monomer or polymer and/or urea monomer or polymer. Examples of aldehyde monomers are formaldehyde, furfural and butyral. Examples of alcohol monomers are phenol, cresol, resorcinol and xylenol. An example of polyalcohol is polyvinyl alcohol. Examples of amine monomers are aniline and melamine. Examples of urea monomers are urea, thiurea and dicyandiamide. An example of an aldehyde polymer is polyvinyl butyral formed from butyral and polyvinylalcohol.

Epoxide polymers are polymers formed from at least one epoxide monomer and at least one alcohol monomer and/or amine monomer. Examples of epoxide monomers are epichlorhydrine and glycidol. Examples of alcohol monomers are phenol, cresol, resorcinol, xylenol, bisphenol A and glycol. An example of epoxide polymer is phenoxy resin, which is formed from epichlorihydrin and bisphenol A.

Polyamides are polymers formed from at least one monomer having an amide group or an amino as well as a carboxy group or from at least one monomer having two amino groups and at least one monomer having two carboxy groups. An example of a monomer having an amide group is caprolactam. An example of a diamine is 1,6-diaminohexane. Examples of dicarboxylic acids are adipic acid, terephthalic acid, isophthalic acid and 1,4-naphthalene-dicarboxylic acid. Examples of polyamides are polyhexamethylene adipamide and polycaprolactam.

Polyesters polymers formed from at least one monomer having an hydroxy as well as a carboxy group or from at least one monomer having two hydroxy groups and at least one monomer having two carboxy groups or a lactone group. An example of a monomer having a hydroxy as well as a carboxy group is adipic acid. An example of a diol is ethylene glycol. An example of a monomer having a lactone group is caprolactone. Examples of dicarboxylic acids are terephthalic acid, isophthalic acid and 1,4-naphthalenedicarboxylic acid. An example of a polyester is polyethylene terephthalate. So-called alkyd resins are also regarded to belong to polyester polymers.

Polyurethane are polymers formed from at least one diisocyanate monomer and at least one polyol monomer and/or polyamine monomer. Examples of diisocyanate monomers are hexamethylene diisocyanate, toluene diisiocyanate and diphenylmethane diiscocyanate.

Examples of sulfone-based polymers are polyarylsulfone, polyethersulfone, polyphenylsulfone and polysulfone. Polysulfone is a polymer formed from 4,4-dichlorodiphenyl sulfone and bisphenol A.

Examples of natural polymers are starch, cellulose, gelatine, caesin and natural rubber. Examples of derivatives are oxidised starch, starch-vinyl acetate graft copolymers, hydroxyethyl cellulose, hydroxypropyl cellulose, methyl cellulose, ethyl cellulose, carboxymethyl cellulose and acetyl cellulose.

The polymeric binders are known in the art and can be produced by known methods, e.g. by polymerisation starting from suitable monomers.

Preferably, the polymeric binder is selected from the group consisting of acrylic polymers, styrene polymers, vinyl polymers and derivatives thereof, polyolefins, polyurethanes and natural polymers and derivatives thereof.

More preferably, the polymeric binder is selected from the group consisting of acrylic polymers, styrene butadiene copolymers, styrene-maleic anhydride copolymers, polyvinyl alcohol, polyvinyl acetate, partially hydrolysed polyvinyl acetate, methyl vinyl ether-maleic anhydride copolymers, carboxy-modified polyvinyl alcohol, acetoacetyl-modified polyvinyl alcohol, diacetone-modified polyvinyl alcohol and silicon-modified polyvinyl alcohol, isopropylene-maleic anhydride copolymer, polyurethane, cellulose, gelatine, caesin, oxidised starch, starch-vinyl acetate graft copolymers, hydroxyethyl cellulose, methyl cellulose, ethyl cellulose, carboxymethyl cellulose and acetyl cellulose.

Even more preferably, the polymeric binder is an acrylic polymer. Most preferably, the polymeric binder is poly(methyl methacrylate).

Preferably, the composition of the present invention can also comprise additional components.

The additional components that may be included in the coating composition can be a char forming compound or a component suitable for improving the performance of the composition.

Examples of char forming compounds are carbohydrates such as monosaccharides, disaccharides and polysaccharides, and derivatives thereof wherein the carbonyl group has been reduced to a hydroxyl group, so-called sugar alcohols.

Examples of monosaccharides are glucose, mannose, galactose, arabinose, fructose, ribose, erythrose and xylose. Examples of disaccharides are maltose, cellobiose, lactose and saccharose. Examples of polysaccharides are cellulose, starch, gum arabic, dextrin and cyclodextrin. Examples of sugar alcohols are meso-erythritol, sorbitol, mannitol and pentaerythritol.

Preferred char forming compounds are monosaccharides and disaccharides. More preferred char forming compounds are saccharose and galactose. The most preferred char forming compound is saccharose.

Components suitable for improving the performance of the composition can absorb the incident energy and transfer this energy to the system thermally or otherwise such as IR absorber or UV absorber. Examples of other types of additional components that improve the performance of the composition are pigments, stabilizers, antioxidants, rheology modifiers, wetting agents, biocides, smoke suppressants and taggants. Taggants are various substances added to a product to indicate its source of manufacture.

Examples of IR absorbers are alkylated triphenyl phosphorothionates, for example as sold under the trade name Ciba® Irgalube® 211. An example of a UV absorber is 2-hydroxy-4-methoxybenzophenone.

Pigments can be added for enhanced contrast between unimaged and imaged areas or as a security feature.

Examples of pigments which can be added for enhanced contrast between umimaged and imaged area are titanium dioxide, calcium carbonate, kaolin, calcined kaolin, aluminium hydroxide, talc, zinc oxide, amorphous silica, barium sulfate, polystyrene resin, urea-formaldehyde resin, hollow plastic pigment and mixtures thereof.

Examples of pigments which can be added as a security feature are fluorescent pigments or magnetic pigments.

Examples of rheology modifiers are xanthan gum, methylcellulose, hydroxypropyl methylcellulose, or acrylic polymers such as sold under the tradenames Ciba® Rheovis® 112, Ciba® Rheovis® 132 and Ciba® Rheovis® 152.

An example of a wetting agent is Ciba® Irgaclear® D, a sorbitol based clarifying agent, Examples of biocides are Acticide® MBS, which includes a mixture of chloromethyl isothiazolinone and methyl isothiazolinone, Biocheck® 410, which includes a combination of 2-dibromo-2,4-dicyanobutane and 1,2-benzisothiazolin-3-one, Biochek®721M, which includes a mixture of 1,2-dibromo-2,4-dicyanobutane and 2-bromo-2-nitro-1,3-propandiol and Metasol®TK 100, which includes 2-(4-thiazolyl)-benzimidazole.

An example of a smoke suppressant is ammonium octamolybdate.

The coatings formed by the coating compositions of the present invention can be coated with a laminate layer or overprint varnish. If the material of the laminate layer or the overprint varnish is selected so that it does not absorb at the wavelength of the imaging laser then the laser sensitive coating can be imaged through the laminate layer without damaging or marking the laminate. Also the laminate or overprint varnish is ideally chosen that it does not result in colouration of the coating before the energy treatment.

The composition of the present invention can comprise 1 to 50%, preferably 1 to 40%, more preferably, 1 to 20%, most preferably 1 to 5% by weight of the latent activator based on the weight of the total composition.

The composition of the present invention can comprise 0.1 to 50%, preferably 0.1 to 40%, more preferably 0.1 to 20% and most preferably 0.1 to 5% by weight of the colour former based on the weight of the total composition.

The composition of the present invention can comprise 10 to 95%, preferably 20 to 95%, more preferably 50 to 95% and most preferably 70 to 90% by weight of the solvent based on the weight of the total composition.

The composition of the present invention can comprise 1 to 80%, preferably 1 to 60%, more preferably 1 to 40% and most preferably 1 to 20%, by weight of the polymeric binder based on the weight of the total composition.

The composition of the present invention can comprise 0 to 30%, preferably 0 to 20%, more preferably 0 to 10% and most preferably 0 to 5% by weight of additional components based on the weight of the total composition.

The composition of the present invention can consist of 1 to 50% by weight of the latent activator, 0.1 to 50% by weight of the colour former, 10 to 95% by weight of the solvent, 1 to 80% by weight of the polymeric binder, and 0 to 30% by weight of additional components, all based on the weight of the total composition.

Preferably, the composition of the present invention can consist of 1 to 40% by weight of the latent activator, 0.1 to 40% by weight of the colour former, 20 to 95% by weight of the solvent, 1 to 60% by weight of the polymeric binder and 0 to 20% by weight of additional components, all based on the weight of the total composition.

More preferably, the composition of the present invention can consist of 1 to 20% by weight of the latent activator, 0.1 to 20% by weight of the colour former, 50 to 95% by weight of the solvent, 1 to 40% by weight of the polymeric binder and 0 to 10% by weight of additional components, all based on the weight of the total composition.

Most preferably, the composition of the present invention can consist of 1 to 5% by weight of the latent activator, 0.1 to 5% by weight of the colour former, 70 to 90% by weight of the solvent, 1 to 20% by weight of the polymeric binder and 0 to 5% by weight of additional components, all based on the weight of the total composition.

Also part of the invention is a process for preparing the composition of the present invention which process comprises mixing a latent activator and a colour former. Preferably, the process comprises mixing a latent activator, a colour former and a solvent. More preferably, the process comprises mixing a latent activator, a colour former, a solvent, a polymeric binder, and optionally additional components.

Also part of the invention is a substrate coated with the coating composition of the present invention.

The substrate can be a sheet or any other three dimensional object, it can be transparent or opaque and it can have an even or uneven surface. An example of a substrate having an uneven surface is a filled paper bag, such as a paper bag of cement. The substrate can be made from paper, cardboard, metal, wood, textiles, glass, ceramics and/or polymers. The substrate can also be a pharmaceutical tablet or foodstuff. Examples of polymers are polyethylene terephthalate, low density-polyethylene, polypropylene, biaxially orientated polypropylene, polyether sulfone, polyvinyl chloride polyester and polystyrene. Preferably, the substrate is made from paper, cardboard or polymer.

The thickness of the coating usually chosen is in the range of 0.1 to 1000 μm. Preferably, it is in the range of 1 to 500 μm. More preferably, it is in the range of 1 to 200 μm. Most preferably, it is in the range of 1 to 120 μm.

Another aspect of the present invention is a process for preparing a coated substrate, which comprises the step of coating a substrate with the composition of the present invention.

The substrate can be coated with the composition of the present invention by using a standard coating application as such as a bar coater application, rotation application, spray application, curtain application, dip application, air application, knife application, blade application or roll application. The composition can also be applied to the substrate by various printing methods such as silk screen printing, gravure printing, offset printing and flexo printing. If the substrate is paper, the composition can also be applied in the size press or at the wet-end of the paper machine.

The coating composition can be dried, for example at ambient or elevated temperature. The elevated temperature is ideally chosen to avoid image formation before exposure to the energy.

Also part of the invention is a process for preparing a marked substrate, which comprises the steps of i) coating a substrate with the composition of the present invention, and ii) exposing those parts of the coated substrate, where a marking is intended, to energy in order to generate a marking.

The energy can be heat or any other energy, which yields a marking when applied to the substrate coated with the composition of the present invention. Examples of such energy are UV, IR, visible or microwave irradiation.

The energy can be applied to the coated substrate in any suitable way, for example heat can be applied by using a thermal printer, and UV, visible and IR irradiation can be applied by using a UV, visible or IR laser. Examples of IR lasers are $CO_2$ lasers, Nd:YAG (neodym-yttrium-aluminum garnet) lasers and IR semicoductor lasers.

Preferably, the energy is IR irradiation. More preferably, the energy is IR irradiation having a wavelength in the range of 780 to 1'000'000 nm. Even more preferably, the energy is IR irradiation generated by a $CO_2$ laser or a Nd:YAG laser. Most preferably, the energy is IR irradiation generated by a $CO_2$ laser having a wavelength of 10'600 nm.

Typically the exact power of the IR laser and the line speed is determined by the application and chosen to be sufficient to generate the image, for example, when the wavelength of the IR laser is 10'600 nm and the diameter of the laser beam is 0.35 mm, the power is typically 0.5 to 4 W, and the line speed is typically 300 to 1'000 mm/s.

Yet another aspect of the invention is the marked substrate, which is obtained by above process.

The coating composition of the present invention has the advantage that transparent, high contrast coloured images of any desired colour can be produced without the use of heavy metals.

EXAMPLES

Example 1

5.0 g (0.05 mol) cyclohexanol and 11.2 g (0.1 mol) 1,4-diazabicyclo[2.2.2]octane are added to 50 mL ethyl acetate. This solution is cooled in an ice bath and 14.3 g (0.075 mol) tosyl chloride in 30 ml ethyl acetate is added drop-wise over 15 minutes. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated and the resulting oil is purified by column chromatography to yield 11.5 g (90%) of cyclohexyl-p-toluenesulfonate.

Example 2

5.7 g (0.05 mol) 2-methylcyclohexanol and 11.2 g (0.1 mol) 1,4-diazabicyclo[2.2.2]octane are added to 50 mL ethyl acetate. This solution is cooled in an ice bath and 14.3 g (0.075 mol) tosyl chloride in 30 mL ethyl acetate is added drop-wise over 20 minutes. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated to yield 12.7 g (95%) of 2-methylcyclohexyl-p-toluenesulfonate.

Example 3

7.8 g (0.05 mol) DL-menthol and 11.2 g (0.1 mol) 1,4-diazabicyclo[2.2.2]octane are added to 50 mL ethyl acetate. This solution is cooled in an ice bath and 14.3 g (0.075 mol) tosyl chloride in 30 mL ethyl acetate is added dropwise over 15 mins. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated to yield 11.5 g (74%) of menthyl-p-toluenesulfonate.

Example 4

5.8 g (0.05 mol) 1,4-cyclohexanediol and 22.4 g (0.2 mol) 1,4-diazabicyclo[2.2.2]octane are added to 75 mL ethyl acetate. This solution is cooled in an ice bath and 28.6 g (0.15 mol) tosyl chloride in 75 mL ethyl acetate is added dropwise over 15 mins. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated to yield 20.2 g (95%) of menthyl-p-toluenesulfonate.

Example 5

4.3 g (0.025 mol) ethyl 4-hydroxycyclohexanecarboxylate and 5.6 g (0.05 mol) 1,4-diazabicyclo[2.2.2]octane are added to 25 mL ethyl acetate. This solution is cooled in an ice bath and 7.15 g (0.0375 mol) tosyl chloride in 20 ml ethyl acetate is added dropwise over 15 mins. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated to yield 7.0 g (90%) of menthyl-p-toluene-sulfonate.

Example 6

4.3 g (0.025 mol) 2,2-dimethyl-1-propanol and 5.6 g (0.05 mol) 1,4-diazabicyclo[2.2.2]octane are added to 25 mL ethyl acetate. This solution is cooled in an ice bath and 7.15 g (0.0375 mol) tosyl chloride in 20 mL ethyl acetate is added dropwise over 15 mins. The ice bath is removed and the mixture is allowed to stir at room temperature for 4 days. After this time the solid precipitate is filtered and washed. The ethyl acetate filtrate and washings are then combined and washed successively with 10% HCl, saturated aq $NaHCO_3$ and brine. The ethyl acetate is then evaporated to yield 5.6 g (92%) of menthyl-p-toluenesulfonate.

Example 7

Cyclohexyl-p-toluenesulphonate (1.0 g) prepared as described in example 1 is stirred in acetone (8.6 g). To this mixture is added in the following order: crystal violet lactone, sold for example as Ciba® Pergascript® Blue I-2RN, (1.0 g), poly(methyl methacrylate) (3.4 g), 2-hydroxy-4-methoxy-benzophenone (0.6 g) and methyl ethyl ketone (17.6 g). The coating composition is then applied by a coating bar onto plain paper, coated paper or polyethylene terephthalate film to form a coating layer of 120 μm, dried at ambient temperature and imaged using a $CO_2$ laser (wavelength: 10600 nm, power: 0.5 to 4 W, diameter of laser beam: 0.35 mm, line speed: 300 to 1000 mm/s) to yield a blue mark.

Example 8

A coating composition is prepared as described in example 7, except that the tosylated alcohol (1.0 g) prepared as described in example 2 is used.

Example 9

A coating composition is prepared as described in example 7, except that the tosylated alcohol (1.0 g) prepared as described in example 3 is used.

Example 10

A coating composition is prepared as described in example 7, except that the tosylated alcohol (1.0 g) prepared as described in example 4 is used.

Example 11

A coating composition is prepared as described in example 7, except that the tosylated alcohol (1.0 g) prepared as described in example 5 is used.

Example 12

A coating composition is prepared as described in example 7, except the tosylated alcohol (1.0 g) prepared as described in example 6 is used.

Example 13

The tosylated alcohol (1.0 g) prepared as described in example 5 is stirred in acetone (8.6 g) To this mixture is added in the following order: Ciba® Pergascript® Red I-6B (0.25 g), poly(methyl methacrylate) (3.4 g), 2-hydroxy-4-methoxybenzophenone (0.6 g) and methyl ethyl ketone (17.6 g). The coating composition is then applied by a coating bar onto plain paper, coated paper or polyethylene terephthalate film to form a coating layer of 120 μm, dried at ambient temperature and imaged using a $CO_2$ laser (wavelength: 10600 nm, power: 0.5 to 4 W, diameter of laser beam: 0.35 mm, line speed: 300 to 1000 mm/s) to yield a red mark.

Example 14

The tosylated alcohol (1.0 g) prepared as described in example 5 is stirred in acetone (8.6 g) To this mixture is added in the following order: Ciba® Pergascript® Orange I-G (0.25 g), poly(methyl methacrylate) (3.4 g), 2-hydroxy-4-methoxybenzophenone (0.6 g) and methyl ethyl ketone (17.6 g). The coating composition is then applied by a coating bar plain paper, coated paper or polyethylene terephthalate film to form a coating layer of 120 μm, dried at ambient temperature and imaged using a $CO_2$ laser (wavelength: 10600 nm, power: 0.5 to 4 W, diameter of laser beam: 0.35 mm, line speed: 300 to 1000 mm/s) to yield an orange mark.

The invention claimed is:

1. A composition comprising a latent activator and a colour former, wherein the latent activator is an ester derivative of an organic sulfuric acid selected from the group consisting of 4-styrene sulfonic acid, p-toluenesulfonic acid, benzene sulfonic acid, xylene sulfonic acid, phenol sulfonic acid, methane sulfonic acid, trifluormethane sulfonic acid, poly(4-styrene sulfonic acid) and copolymers comprising 4-styrene sulfonic acid units, and wherein the colour former is selected from the group consisting of phthalides, fluorans, triarylmethanes, benzoxazines, quinazolines, spiropyrans, thiazines and oxazines and mixtures thereof.

2. The composition of claim 1, wherein the composition also comprises a solvent.

3. The composition of claim 1, wherein the composition also comprises a polymeric binder.

4. A process for preparing the composition of claim 1, which comprises the step of mixing a latent activator and a colour former.

5. A substrate coated with the coating composition of claim 1.

6. A process for preparing a coated substrate, which comprises the step of coating a substrate with the composition of claim 1.

7. A process for preparing a marked substrate, which comprises the steps of i) coating a substrate with the composition of claim 1, and ii) exposing those parts of the coated substrate, where a marking is intended, to energy in order to generate a marking.

8. The process of claim 7, wherein the energy is selected from the group consisting of UV, IR, visible and microwave irradiation.

9. A marked substrate, which is obtained by the process of claim 6.

10. The composition of claim 3, wherein the polymeric binder is acrylic polymer, styrene polymer and hydrogenated products thereof, vinyl polymer and derivatives thereof, polyolefin and hydrogenated or epoxidized products thereof, aldehyde polymer, epoxide polymer, polyamide, polyester, polyurethane, sulfone-based polymer and natural polymers and derivatives thereof, or mixtures thereof.

11. The composition of claim 1 further comprising a char forming compound, wherein the char forming compound is selected from the group consisting of glucose, mannose, galactose, arabinose, fructose, ribose, erythrose, xylose, maltose, cellobiose, lactose, saccharose, cellulose, starch, gum arabic, dextrin, cyclodextrin, meso-erythritol, sorbitol, mannitol, and pentaerythritol.

12. The composition of claim 1, wherein the latent activator is present in an amount of 1 to 50% by weight and the colour former is present in an amount of 0.1 to 50% by weight.

13. The composition of claim 3, wherein the polymeric binder is present in an amount of 1 to 80% by weight.

14. The composition of claim 1, wherein the colour former is 3,3-bis(p-dimethylaminophenyl)-6-dimethylaminophthalide, 3,3-bis(1-octyl-2-methylindol-3-yl)phthalide, or 3-diethylamino-7-(ethoxycarbonyl)-fluoran.

* * * * *